United States Patent
Weiß et al.

(10) Patent No.: US 12,264,914 B2
(45) Date of Patent: Apr. 1, 2025

(54) DEVICE AND METHOD FOR MEASURING WAFERS

(71) Applicant: PRECITEC OPTRONIK GMBH, Neu-Isenburg (DE)

(72) Inventors: Stephan Weiß, Rodgau (DE); Simon Mieth, Frankfurt am Main (DE); Corinna Weigelt, Langen (DE); Tobias Beck, Heusenstamm (DE)

(73) Assignee: PRECITEC OPTRONIK GMBH, Neu-Isenburg (DE)

( * ) Notice: Subject to any disclaimer, the term of this patent is extended or adjusted under 35 U.S.C. 154(b) by 0 days.

(21) Appl. No.: 18/673,052

(22) Filed: May 23, 2024

(65) Prior Publication Data
US 2024/0310159 A1   Sep. 19, 2024

Related U.S. Application Data

(63) Continuation of application No. PCT/EP2023/051737, filed on Jan. 25, 2023.

(30) Foreign Application Priority Data

Feb. 24, 2022 (DE) .................. 10 2022 104 416.5

(51) Int. Cl.
*G01B 9/02091* (2022.01)
*G01B 9/02055* (2022.01)
*G01B 11/06* (2006.01)

(52) U.S. Cl.
CPC ..... *G01B 9/02091* (2013.01); *G01B 9/02072* (2013.04); *G01B 11/06* (2013.01)

(58) Field of Classification Search
CPC .............. G01B 9/0209; G01B 9/02091; G01B 9/02072; G01B 9/02057; G01B 9/02002;
(Continued)

(56) References Cited

U.S. PATENT DOCUMENTS

| 5,321,501 A | 6/1994 | Swanson |
| 5,459,570 A | 10/1995 | Swanson |

(Continued)

FOREIGN PATENT DOCUMENTS

| CN | 114074213 A | 2/2022 |
| DE | 69227902 T2 | 1/1999 |

(Continued)

OTHER PUBLICATIONS

Michael Muth Optimized x/y scanning head for laser beam positioning; Proceedings of SPIE, Design and Engineering of Optical Systems; Aug. 1996; pp. 535-544 (Year: 1996).*

(Continued)

*Primary Examiner* — Uzma Alam
*Assistant Examiner* — Jonathon Cook
(74) *Attorney, Agent, or Firm* — Lempia Summerfield Katz LLC

(57) ABSTRACT

A device for measuring wafers includes an optical coherence tomograph and a scanning device that scans the surface of the wafer successively at a plurality of measuring points. Two measuring points have a distance $d_{max}$ of 140 mm≤$d_{max}$≤600 mm. An evaluation unit calculates distance values and/or thickness values from the interference signals provided by the optical coherence tomograph.

14 Claims, 3 Drawing Sheets

(58) Field of Classification Search
CPC . G01B 11/06; G01B 11/0675; G01B 11/2441; G01N 21/47; G01N 2021/1734; G01N 2021/1787
See application file for complete search history.

(56) References Cited

U.S. PATENT DOCUMENTS

| | | | |
|---|---|---|---|
| 10,234,265 | B2 | 3/2019 | Schönleber |
| 2007/0046948 | A1 | 3/2007 | Podoleanu |
| 2008/0013078 | A1 | 1/2008 | Podoleanu |
| 2012/0232686 | A1 | 9/2012 | Xin |
| 2012/0257207 | A1 | 10/2012 | Marx |
| 2012/0320380 | A1* | 12/2012 | Schonleber ........ G01B 9/02044 356/479 |
| 2014/0107960 | A1 | 4/2014 | Oritz Egea |
| 2016/0039045 | A1* | 2/2016 | Webster ............. G01B 9/02091 356/450 |
| 2018/0164089 | A1 | 6/2018 | Schönleber |
| 2018/0178320 | A1 | 6/2018 | Webster |
| 2019/0299327 | A1 | 10/2019 | Webster |
| 2019/0310463 | A1 | 10/2019 | Boehmer |
| 2019/0350459 | A1 | 11/2019 | Hong |
| 2020/0246911 | A1 | 8/2020 | Webster |
| 2022/0055147 | A1 | 2/2022 | Yokoyama |
| 2023/0036545 | A1 | 2/2023 | Webster |

FOREIGN PATENT DOCUMENTS

| | | |
|---|---|---|
| DE | 102017128158 A1 | 6/2018 |
| DE | 102021120767 A1 | 2/2022 |

OTHER PUBLICATIONS

International Search Report and Written Opinion cited in corresponding international patent application No. PCT/EP2023/051737; Apr. 28, 2023; 11 pp.

Michael Muth, Optimized x/y scanning head for laser beam positioning; Proceedings of SPIE, Design and Engineering of Optical Systems; Aug. 1996; pp. 535-544.

Xinping Liu et al., Full-field optical coherence tomography using a spatial filter; Proceedings of SPIE, Novel Optical Systems Design and Optimization VI; Nov. 2003; pp. 179-186.

* cited by examiner

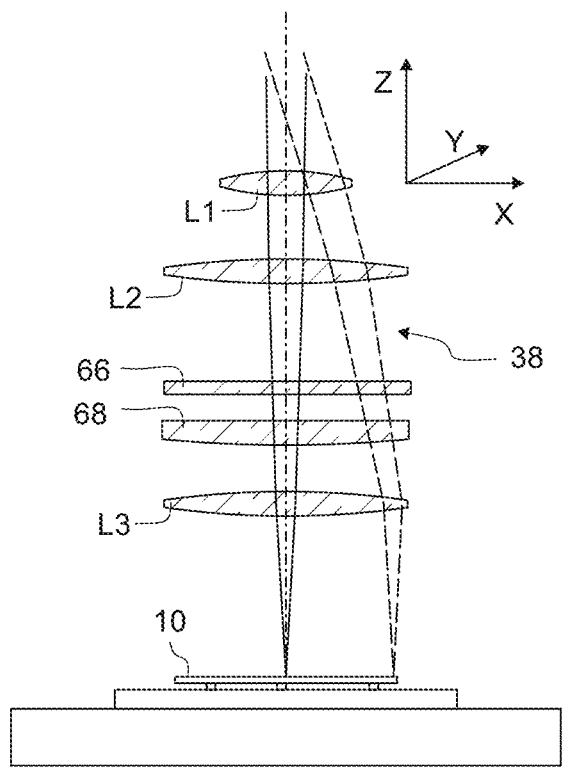 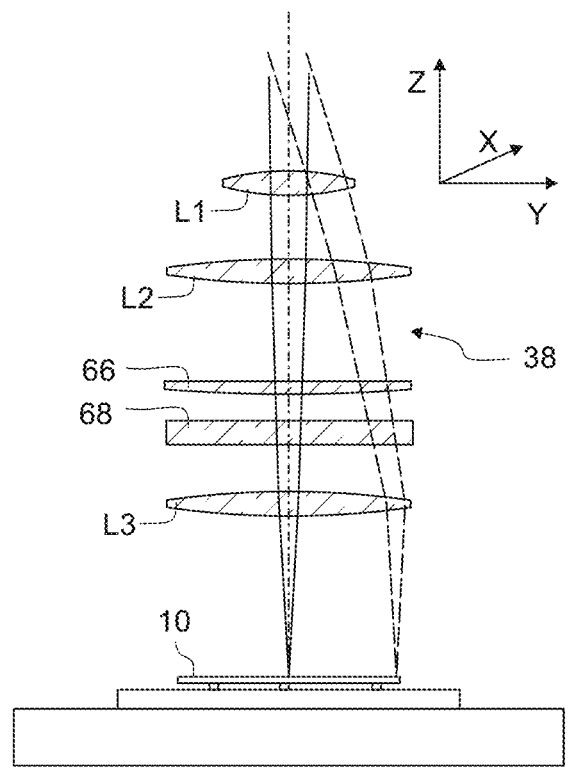
Fig. 5a    Fig. 5b
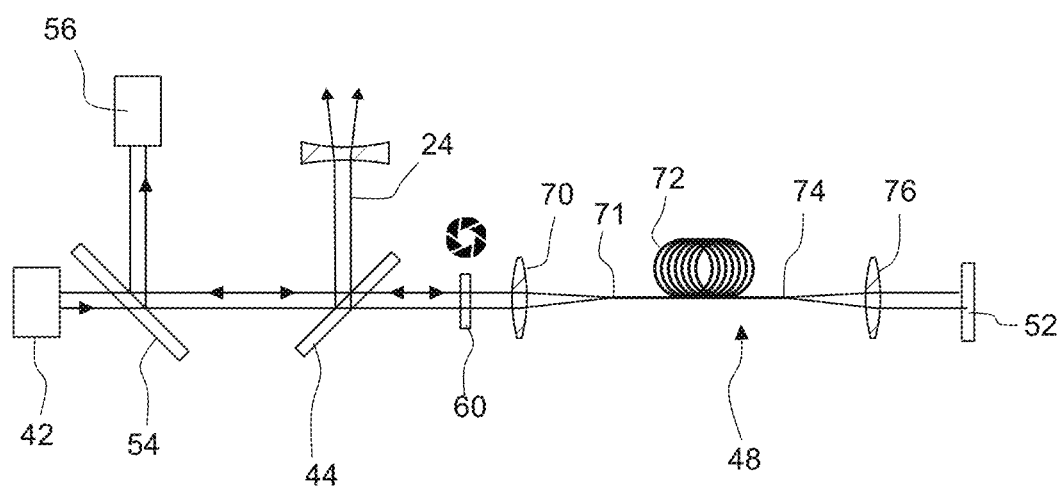
Fig. 6

DEVICE AND METHOD FOR MEASURING WAFERS

CROSS-REFERENCE TO RELATED APPLICATIONS

This application is a continuation application of International Application No. PCT/EP2023/051737 filed Jan. 25, 2023 and claims the benefit of and priority to earlier German patent application No. 102022104416.5 filed Feb. 24, 2022. The entire disclosures of these earlier patent applications are hereby incorporated by reference as if fully set forth herein.

BACKGROUND

1. Technical Field

The present disclosure relates to a device and a method for non-contact measurement of geometric variables of wafers such as TTV, bow or warp.

2. Description of the State of the Art

Wafers are circular or square discs around one millimeter thick that serve as a substrate for integrated circuits, micromechanical components or photoelectric coatings. Wafers are manufactured from monocrystalline or polycrystalline blanks (so-called ingots), which are sawn into individual wafers at right angles to their longitudinal axis. In most cases, silicon wafers are used, but other materials are also used, e.g. glass wafers for the production of microlens arrays or for augmented reality applications.

The shape of the wafer must meet tight geometric specifications. These specifications include the TTV (Total Thickness Variation), which is the maximum difference between the thickest and thinnest point of a wafer. Bow is defined as the maximum deviation of the median area of the wafer from a reference plane. Warp is understood by persons of ordinary skill in the art as the deviation of the median area of the wafer from the reference plane, where the bow is already corrected over the entire wafer area.

In addition to these common definitions of TTV, bow and warp, similar, slightly different definitions are sometimes used in the characterization of wafers to characterize deviation of the wafer from the ideal shape.

In order to comply with the specifications, these geometric parameters must be measured at least randomly and, in one example, during the regular production process.

A device for measuring wafers is known from US 2012/0257207 A1, which combines a Michelson interferometer for distance measurements with a reflectometer used for thickness measurements. The measurement is carried out at individual points. In order to obtain measurement values over the entire surface, the wafer is moved relative to the stationary measuring device.

However, this known measuring method is slow, as the wafer cannot be moved as quickly as required due to its inertia. The corresponding measuring devices are also expensive, as the actuators for moving the wafer must be of a particularly high quality to ensure that the movements are smooth and precise.

SUMMARY

It is an object of the present disclosure to provide a device and a method with which wafers can be measured very quickly and yet cost-effectively.

According to an aspect of the disclosure, this object is achieved by a device for measuring wafers comprising an optical coherence tomograph configured to generate a measuring light beam and to direct it onto the wafer via an optical system, a scanning device configured to deflect the measuring light beam in two spatial directions, a control unit configured to control the scanning device in such a way that the measuring light beam scans the surface of the wafer successively at a plurality of measuring points, wherein two measuring points have a distance $d_{max}$ of 140 mm$\leq d_{max} \leq$600 mm, and an evaluation unit configured to calculate distance values and/or thickness values from interference signals provided by the optical coherence tomograph.

The disclosure is based on the conception that a known measuring device with an optical coherence tomograph and a scanning device can be used for wafer measurement if, on the one hand, a larger optical system is used which enables a larger measuring field and, above all, solves the problem of field curvature. The inventors have developed several approaches to solve this problem.

One such measuring device known as such is known from US 2018/0164089 A1. In one embodiment described there, an optical coherence tomograph (OCT) generates a measuring light beam that is deflected by a mirror scanner, with one scanning mirror being provided for each deflection direction. After passing through a plane-field objective, the measuring light beam strikes the surface to be measured essentially parallel to the axis, resulting in a telecentric beam path. When scanning the surface, only the very light scanning mirror moves while the object to be measured remains stationary. This allows its surface to be scanned very quickly.

Another advantage of such a measuring device is that the deflection of the mirrors can be read out in real time and adjusted to the target deflection using a control loop. Even if the scan mirrors are subject to parasitic residual oscillations due to their movement, this enables very precise positioning of the measuring light beam on the object to be measured.

The inventors have discovered that with this known measuring device, a field curvature occurs when the measuring light beam scans the surface of a wafer in two dimensions. To put it illustratively, this means that the focus of the measuring light beam does not sweep a plane during scanning, but a curved surface. An actually flat wafer surface therefore appears curved.

While the field curvature could still be tolerated with very small wafers up to a diameter of around 80 mm, this is not possible with larger wafers, as the field curvature increases quadratically with the diameter of the wafer to be measured. Larger wafers are considered here to be wafers for which two measuring points that can be reached by the scanning device can have a distance $d_{max}$ of 140 mm$\leq d_{max} \leq$600 mm and, in one example, 280 mm$\leq d_{max} \leq$450 mm. For a distance $d_{max}$=300 mm, the measurement error due to the field curvature is typically already around 1 mm. Without additional measures, the measuring device described above is therefore unsuitable for measuring larger wafers, even if a larger plane-field objective is used, as the required accuracy for distance measurement is less than 1 µm. The measuring error of the known measuring device is therefore three orders of magnitude too large for larger wafers.

The inventors also recognized that the additional optical path length differences that lead to the field curvature are primarily caused by the scan mirrors. In order to be able to swivel without collision, the two scan mirrors must be relatively far apart. It has been found that the spatial distance between the axes of rotation of the scan mirrors makes the dominant contribution to the field curvature.

The simplest way to reduce the field curvature is therefore to use a single scan mirror that can be rotated around two axes instead of two scan mirrors, each of which can be rotated around exactly one axis. However, the currently available two-axis scan mirrors cannot be pivoted as quickly and precisely as two single-axis scan mirrors. Compared to the known method, in which the wafer has to be moved, there is nevertheless a significant reduction in the required measuring time.

Another approach to reducing the field curvature is to use two scan mirrors as before, each of which can be rotated around exactly one axis, but to significantly shorten the distance between the scan mirrors. However, there is then a risk that the scan mirrors will collide at larger angles of rotation. To prevent this, a collision protection device can be assigned to at least one of the two scan mirrors, which is configured to limit the angle of rotation of the at least one scan mirror. This is based on the consideration that the available scanning mirrors usually have a rotation angle range that is only partially required for the present application. If the collision protection device limits the initially possible angles of rotation (typically ±20°) to the angles of rotation actually required (e.g. ±10° and, in one example, ±5°), collisions between the scan mirrors can be reliably ruled out even if the distance between the scan mirrors is very small.

The collision protection device can have at least one mechanical stop to limit the angle of rotation. This stop can be a rubber damper, for example, which the at least one scan mirror hits when it is deflected by more than ±10° or ±5°, for example. Alternatively, the stop can act directly on the axis of rotation of the at least one scan mirror or a projection formed on the axis of rotation.

Alternatively, or additionally, it is possible to design the collision device as an electronic limiting device which is configured to electronically prevent a supply of control signals to the at least one scan mirror which would lead to a predetermined angle of rotation range being exceeded. For example, choke coils are very reliable for limiting the control current for the scan mirrors.

Alternatively, or additionally, the control software of the scan mirrors can be designed in such a way that it prevents the generation of control signals that would cause excessive deflection of the scan mirrors. The additional use of one of the above measures is also useful in this case as a safeguard in order to provide for the event that the software malfunctions and a faulty signal is generated that would cause one of the two scan mirrors to deflect too much.

A further alternative or additional measure for reducing the field curvature is to use an optical system which comprises at least one and, in one example, two anamorphic optical elements for correcting the field curvature. In one example, the anamorphic elements are cylindrical lenses. Their axes of symmetry are adapted to the orientation of the axes of rotation of the scan mirrors.

The measure according to the present disclosure is not to reduce the field curvature, but to eliminate its effects by means of calibration. For this purpose, the evaluation unit should be configured to correct the measured distance values by calculation in order to compensate for a curvature of the field into which the optical system focuses the measuring light beams. This field usually coincides with the focal plane of the optical system. During calibration, for example, a high-precision plano glass is measured. The measured deviations from the planarity represent correction values that are subtracted or added from the measured values during subsequent measurements, depending on the sign.

For computational correction, the correction values can be read from a correction table stored in the evaluation unit. In one example, correction values for different operating wavelength ranges are stored in the correction table. These correction values for different operating wavelength ranges do not have to be determined by separate calibration measurements but can also be derived on the basis of theoretical considerations from correction values that have been determined for a specific operating wavelength range. In particular, Zernike polynomials can also be used here.

As an alternative to reading from a correction table, the correction values can also be calculated from a mathematical formula. This formula can be derived from a polynomial fit, for example. Zernike polynomials, for example, can be used as polynomials.

Of course, calibration can also be carried out in addition to the measures described above.

An optical coherence tomograph that can be used for the device of the present disclosure may in particular comprise a light source, a beam splitter configured to split light generated by the light source into the measurement light beam and a reference light beam, a reference arm for guiding the reference light beam, an object arm utilizing the optical system and the scanning device for guiding the measuring light beam, and a detector configured to generate the interference signals from a superposition of the reference light beam guided in the reference arm with a portion of the measuring light beam reflected at the wafer.

In one embodiment, a switchable dimming device is arranged in the reference arm, which is configured to prevent the propagation of the reference light in the reference arm when thickness measurements are made. The switchable dimming device makes it possible to switch between a "distance mode", in which the interference between the measuring light beam and the reference light beam is evaluated, and a "thickness mode". In thickness mode, the interference between the reflections of the measuring light beam at the two plane-parallel interfaces of the wafer is used to infer the distance between the interfaces (i.e. the thickness of the wafer). The detector thus generates the interference signals from a superposition of parts of the measuring light beam reflected at two different interfaces of the wafer. To prevent the unneeded reference light beam from the reference arm from interfering with the desired interference signal in thickness mode, the propagation of the reference light beam in the reference arm is prevented by the dimming device. The dimming device, in one example, is switched automatically each time the measurement mode is changed.

In another embodiment, the reference light beam in the reference arm is not guided as a free beam, or at least not completely, but at least partially in an optical fiber. In coiled optical fibers, light can be guided over long optical path lengths in a small space. If the object arm and the reference arm have different dispersions, measures for dispersion compensation are useful.

With regard to the method, the object mentioned at the outset is achieved by a method for measuring wafers comprising the following steps:
  a) generating a measuring light beam with an optical coherence tomograph;
  b) aiming the measuring light beam at the wafer with an optical system;
  c) deflecting the measuring light beam in two spatial directions with a scanning device, which is controlled in such a way that the measuring beam scans the surface of the wafer successively at a plurality of measuring points;

d) calculating distance values and/or thickness values based on interference signals provided by the optical coherence tomograph.

The scanning device can be controlled so that two measuring points have a distance $d_{max}$ of 140 mm≤$d_{max}$≤600 mm and, in one example, 280 mm≤$d_{max}$≤450 mm.

In one embodiment, the optical coherence tomograph is characterized in that a light source generates light;

a beam splitter splits the light generated by the light source into the measuring light beam and a reference light beam;

the reference light beam is guided in a reference arm;

the measuring light beam is guided in an object arm;

a detector generates the interference signals from a superposition of the reference light beam guided in the reference arm with a portion of the measurement light beam which is reflected by the wafer.

When taking thickness measurements, the propagation of the reference light beam in the reference arm can be temporarily prevented by a dimming device.

If the optical system has a field into which the measuring light beams are focused, the measured distance values can be mathematically corrected in order to compensate for a curvature of the field. For mathematical correction, correction values can be read from a correction table stored in the evaluation unit. Correction values for different operating wavelengths can be stored in the correction table.

BRIEF DESCRIPTION OF THE DRAWINGS

Further features and advantages of the disclosure will be apparent from the following description of embodiments based on the drawings in which:

FIGS. 5a and 5b shows an optical system with cylindrical lenses, which is part of a measuring device according to a further embodiment, in two orthogonal meridional sections;

FIG. 6 shows a reference arm of an optical coherence tomograph according to an embodiment in which the reference light beam travels part of the optical path in an optical fiber.

DETAILED DESCRIPTION OF EMBODIMENTS

1. Measurement of Wafers

Figure 1:
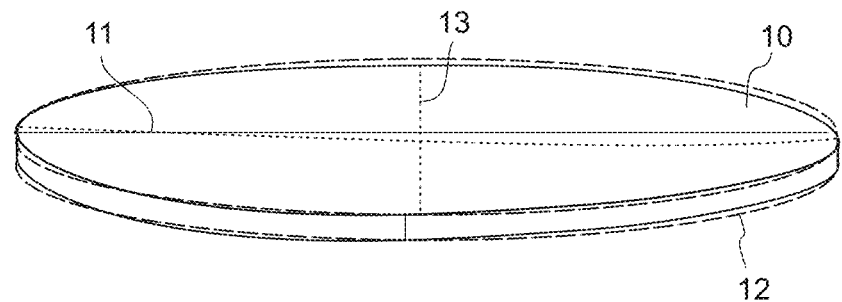
FIG. 1 shows a wafer to be measured in a perspective view and not to scale.

FIG. 1 shows a wafer 10 in a perspective, but not to scale, representation. In the embodiment shown, the wafer 10 has the shape of a straight circular cylinder, wherein the thickness is considerably exaggerated. Real wafers 10 have a diameter of 300 mm, for example, while the thickness is only around 1 mm. Occasionally, wafers 10 are also used whose surface is not circular but square.

The ideal circular cylindrical shape of the wafer 10 is indicated by dashed lines 12. Due to manufacturing tolerances, there may be deviations from this ideal shape, which are exaggerated in FIG. 1. To determine these deviations, the wafer 10 must be measured. If the topography of both wafer surfaces is measured, all common geometric specifications of the wafer such as TTV, bow and warp can be derived.

The distribution of the measuring points at which the topography is measured is adapted to the respective measuring task. In the embodiment shown in FIG. 1, it is assumed that the measuring points are arranged along two lines 11, 13, which are arranged perpendicular to each other, cross in the middle of the wafer 10 and each extend to the circumferential edge of the wafer 10. Other measuring patterns, e.g. spirals or grid patterns, are of course also possible. The measuring points can be very close together and, for example, a few micrometers apart. With other measuring patterns, the distances are in the range of 1 mm.

2. Structure and Function of the Measuring Device

Figure 2:
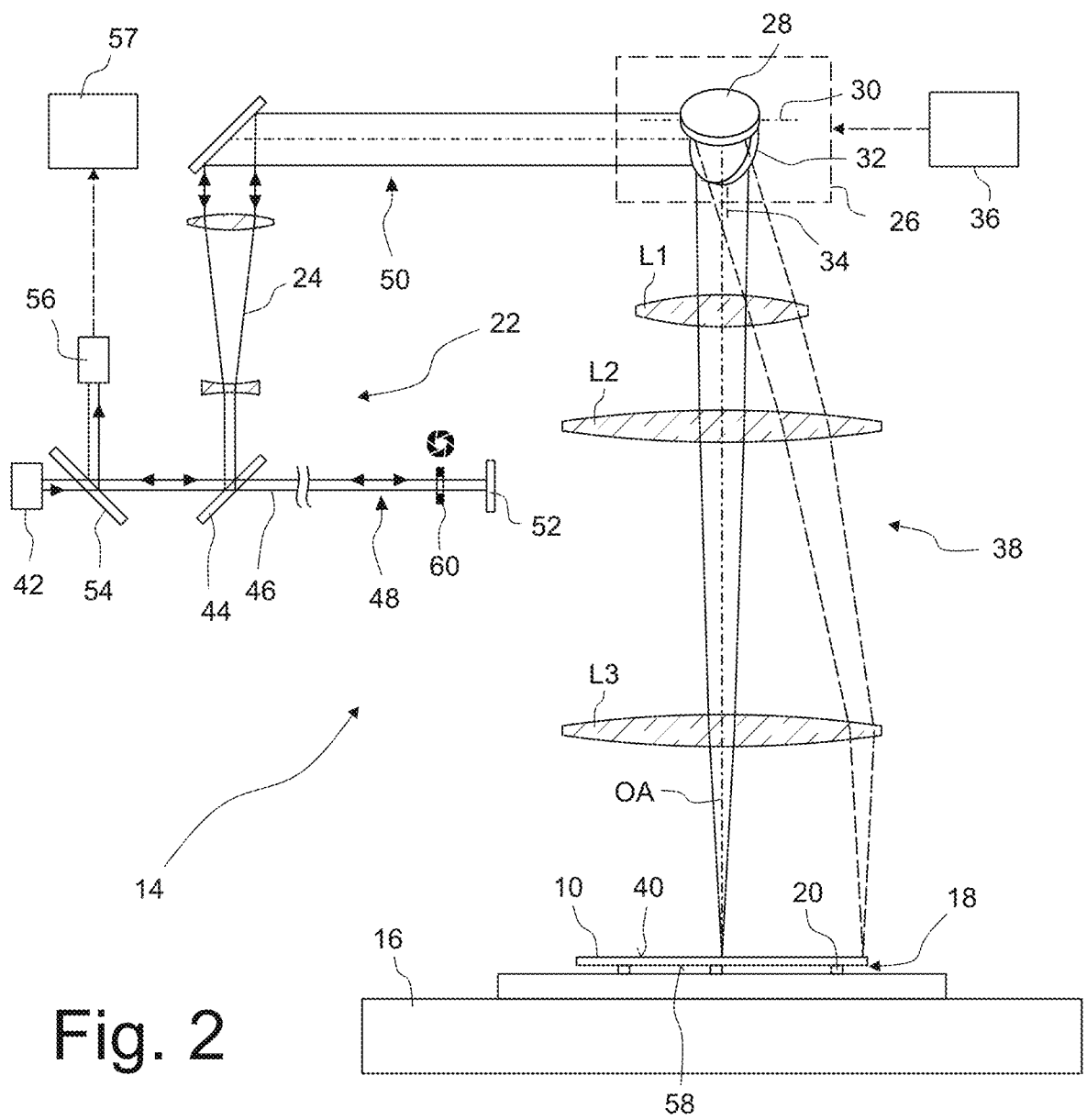
FIG. 2 shows a schematic representation of a measuring device according to an embodiment of the disclosure.

FIG. 2 shows a schematic representation of a measuring device according to an embodiment, designed 14 in its entirety. The measuring device 14 is used to measure a wafer 10, which is supported here by a holder 18. The holder 18 can, for example, be designed as a simple three-point support, as indicated in FIG. 2 by supports 20. In the embodiment shown, the holder 18 is supported on a base 16. Generally, the holder 18 and the base 16 are not part of the measuring device 14. During a measurement within the production process, the wafer 10 can also be fed to the measuring device 14 by a conveyor, for example.

The measuring device 14 comprises an optical coherence tomograph 22, which generates a measuring light beam 24 and whose structure is explained in more detail below.

A scanning device, indicated by 26, variably deflects the measuring light beam 24 into two spatial light directions. For this purpose, the scanning device 26 has a first scanning mirror 28, which is rotatably mounted about a first axis of rotation 30. A second scanning mirror 32 is rotatably mounted about a second axis of rotation 34, which is oriented perpendicular to the first axis of rotation 30. The scanning mirrors 28, 32 are driven by galvanometer drives (not shown), which are controlled by a control unit 36.

The measuring device 14 also includes an optical system 38, which is indicated in FIG. 2 by three lenses L1, L2 and L3. In the embodiment shown, the optical system 38 focuses the measuring light beam 24 deflected by the scanning device 26 so that it always strikes the surface 40 of the wafer 10 facing the optical system approximately perpendicularly.

In a manner known as such, the optical coherence tomograph 22 includes a light source 42, a first beam splitter 44 which splits the light generated by the light source into the measuring light beam 24 and a reference light beam 46, a reference arm 48 for guiding the reference light beam 46, and an object arm 50 utilizing the optical system 38 and the scanning device 26, in which the measuring light beam 24 is guided.

During a measurement, the measuring light beam 24 propagating in the object arm 50 is focused onto the surface 40 of the wafer 10, partially reflected there and returns along the same light path via the object arm 50 to the first beam splitter 44. There, the reflected portion of the measuring light beam 24 overlaps with the reference light beam 46 guided in the reference arm 48 and reflected there at a mirror 52. Both light portions are directed by a second beam splitter 54 onto a detector 56, which converts the optical reference signal into an electrical signal.

In the embodiment shown, the optical coherence tomograph 22 is designed as an FD-OCT (FD stands for Fourier domain). The detector 56 therefore contains a spectrometer that records the spectral intensity distribution. From this, an evaluation unit 57 connected to the detector 56 can calculate the distance of the surface 40 to the measuring device 14 (for example the lens L3) at the point of incidence of the measuring light beam 24 in a manner known as such. For further details of the optical coherence tomograph, reference is made to US 2018/0164089 A1 already mentioned at the outset.

The wavelength range of the light generated by the light source 42 can be selected such that the measuring light beam 24 can penetrate at least partially into the wafer 10. A reflection is then also produced on the lower surface 58 of the wafer 10 facing away from the measuring device 14, which is detected by the optical coherence tomograph 22. In this case, two measuring light beams 24 that have traveled different optical path lengths are superimposed. The detector 56 then detects the difference between the optical path lengths in a manner known per se via the periodicity of the interference, from which the distance between the two surfaces 40, 58 of the wafer 10 and thus its thickness can be deduced.

If the thickness mode described above is selected, it should be prevented that light can also propagate in the reference arm 48, as this would also contribute to interference and thus generate undesirable interference signals. For this purpose, the reference arm 48 contains a switchable dimming device indicated at 60, which can be designed as a central or focal plane shutter, for example. When changing from distance mode to thickness mode, the switchable dimming device 60 is automatically closed, which means that no more light from the reference arm 48 can contribute to the interference on the detector 56. When switching back to the distance mode, the switchable dimming device 60 clears the path for the reference light beam 46 again.

Optionally, the reference arm 48 has a control mechanism for the dimming device 60, in particular a sensor, which can determine the status of the dimming device 60. The control mechanism can be used, for example, to check the current status after an interruption in the power supply.

In the embodiment shown in FIG. 2, the measuring light 24 propagates completely in free space. In other embodiments, the light guidance takes place partially in optical fibers, as will be explained below with reference to FIG. 6. If the optical coherence tomograph 22 is accommodated in its own housing, it is also advisable to guide the light between the optical coherence tomograph 22 and the scanning device 26 in an optical fiber. The scanning device 26 and the optical system 38 can then be accommodated in a spatially compact and lightweight measuring head, which can be mounted at different locations with little effort.

3. Field Curvature

The optical system 38 is configured as a plane-field optical system, so that collimated light entering the optical system 38 is focused into a plane focal plane. However, it was found that the focal points of the measuring light beam 24 do not lie exactly in one plane.

This undesirable field curvature is due to the fact that the two scan mirrors 28, 32 are arranged spatially one behind the other, which results in path length changes that are not easy to visualize. These path length changes increase quadratically with increasing rotation angles of the scan mirrors 28, 32 and thus with increasing distance of the measuring points from the optical axis OA of the optical system 38.

Usually, the optical path length in the reference arm 48 is selected so that it corresponds to the optical path length in the object arm 50 up to the focal point of the measuring light beam 24. If a reflective surface is located outside the focal point, the coherence tomograph 22 interprets this to mean that the surface in question is further or closer than the optical path length specified by the reference arm 48. However, if the focal points of the measuring light beam 24 do not lie exactly in one plane, this results in an actually flat surface appearing curved. At a distance of 150 mm from the optical axis OA, the resulting measurement error is already around 1 mm, which is three orders of magnitude more than the required measurement accuracy of 1 µm.

To solve this problem, a calibration measurement is carried out before the measuring device 14 is delivered. For this purpose, a high-precision calibration standard in the form of a flat glass plate is measured. The deviations from the planarity measured as a result of the field curvature are translated into correction values that are stored in a table in the evaluation unit 57. For each measuring point that can be approached by the scanning device 26 on the surface of the calibration standard, a correction value is determined that is assigned to this measuring point. The assignment of measuring points and correction values can be stored in a table in the evaluation unit 57.

Alternatively, the correction values can be calculated from a formula derived from the calibration measurement. Combined solutions are also conceivable, in which correction values are only stored in a table for individual interpolation points and the correction values for locations between the interpolation points are obtained by interpolation.

If real wafers 10 are measured after such a calibration, the corresponding correction values are added to or subtracted from the measured values obtained, depending on the sign. This results in a corrected set of measured values that can be output to the user of the measuring device 14 for further processing.

4. Measures to Reduce the Field Curvature

As an alternative or in addition to calibration, measures can be taken to reduce the field curvature as far as possible.

Figure 3:
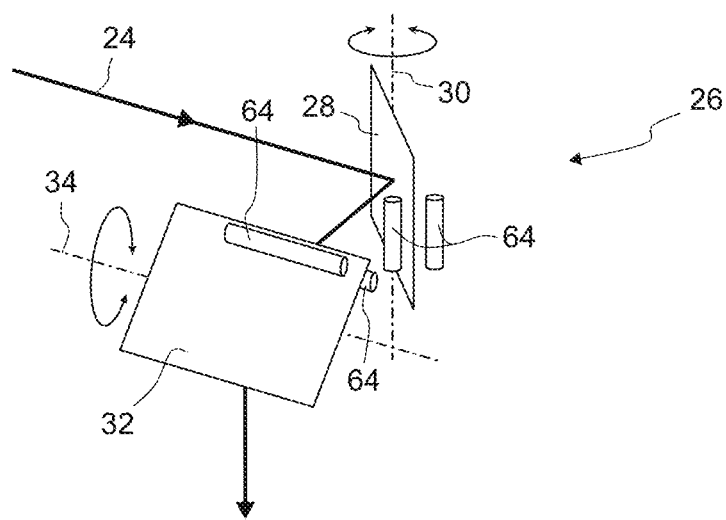
FIG. 3 shows important parts of a scanning device, which is part of a measuring device according to another embodiment and contains mechanical stops for the scanning mirrors, in a simplified perspective view.

One such measure may, for example, be to reduce the distance between the two scan mirrors 28, 32. Normally, this distance is selected such that the scan mirrors 28, 32 cannot collide under any circumstances, even at larger angles of rotation. For the measurement of wafer 10 described above, however, only relatively small rotation angles in the order of ±10° or even only ±5° are usually required. The smaller rotation angles make it possible to arrange the two scanning mirrors 28, 32 closer to each other. However, since the scan mirrors 28, 32 generally have a larger range of rotation angles, a collision protection device must be provided in order to reliably prevent the scan mirrors 28, 32 from touching each other during operation. In the embodiment shown in FIG. 3, the collision protection device has mechanical stops 64, which may be formed by rubber lips, for example. The mechanical stops 64 are positioned in such a way that they limit the angles of rotation of the scan mirrors 28, 32, which are structurally possible as such, to the required angles of rotation.

Depending on the distance and size of the scanning mirrors, it may be sufficient to provide only one of the two scanning mirrors 28, 32 with a collision protection device.

Figure 4:
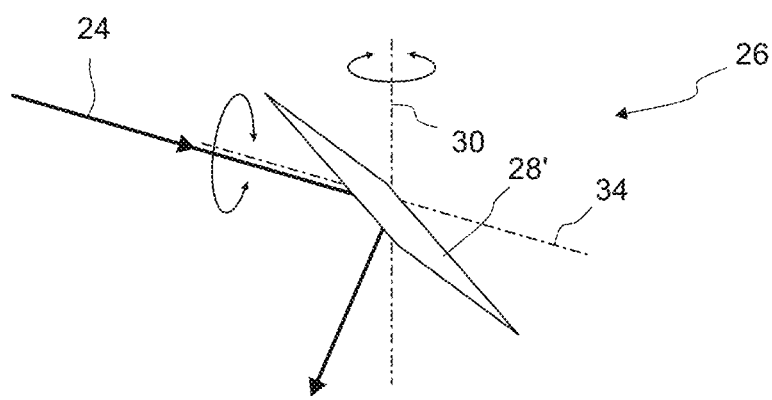
FIG. 4 shows important parts of a scanning device, which is part of a measuring device according to a further embodiment and contains only a single scanning mirror, in a simplified perspective view.

The field curvature is even smaller if the scanning device 26 does not have two scanning mirrors 28, 32, which are each mounted so as to rotate about a single axis of rotation 30 or 34, but only a single scanning mirror 28', which may be mounted about two orthogonal axes of rotation 30, 34, as illustrated by FIG. 4 in a perspective schematic representation.

FIGS. 5*a* and 5*b* show the optical system 38 of the measuring device 14 according to an alternative embodiment in two orthogonal meridional sections, namely in the XZ plane in FIG. 5*a* and in the YZ plane in FIG. 5*b*. Two scan mirrors are also provided in this measuring device 14. The field curvature is reduced here by a suitably configured optical system 38. For this purpose, the optical system 38 has a first cylindrical lens 66 and a second cylindrical lens 68, with the symmetry axes of the cylindrical lenses 66, 68 running perpendicular to one another, as can be seen in FIGS. 5*a*, 5*b*. The two cylindrical lenses 66, 68 are each assigned to one of the two scanning mirrors 28, 32. The orientation of the axes of symmetry of the cylindrical lenses 66, 68 is therefore aligned with the orientation of the axes of rotation 30, 34 of the scan mirrors 28 and 32.

FIG. 6 shows a section of the optical coherence tomograph 22. So that the measuring light beam 24 can also scan large wafers 10 up to their edges, the optical system 38 must have a large focal length, which leads to a large geometric and optical path length in the object arm 50. The optical path length in the reference arm 48 must be correspondingly long.

Since free beam propagation over long distances requires complicated beam folding, it may be more favorable if the measuring light beam 24 is not guided as a free beam in the reference arm 48, or at least not throughout, but at least partially in an optical fiber. In FIG. 6, a coupling lens 70 arranged in the light path behind the dimming device 60 couples the measuring light beam into one end 71 of a coiled optical fiber 72. A second coupling lens 76 is arranged between the end 74 of the optical fiber 72 and the mirror 52 in order to couple the reference light beam reflected at the mirror 52 back into the fiber 72.

The splitting of the reference arm 48 into a fiber-guided and a free-beam-guided part is not limited to the embodiment shown in FIG. 6. In particular, the beam splitter 44 can also be implemented as a fiber coupler in an alternative embodiment.

What is claimed is:

1. A device for measuring wafers, the device comprising:
   an optical coherence tomograph configured to generate a measuring light beam and to direct the measuring light beam onto a wafer via an optical system;
   a scanning device configured to deflect the measuring light beam in two spatial directions;
   a control unit configured to control the scanning device in such a way that the measuring light beam scans the surface of the wafer successively at a plurality of measuring points, wherein two measuring points have a distance $d_{max}$ with 140 mm≤$d_{max}$≤600 mm; and
   an evaluation unit configured to calculate distance values and/or thickness values from interference signals provided by the optical coherence tomograph,
   wherein the scanning device has exactly two scanning mirrors, which are each mounted rotatably about exactly one axis,
   wherein a spatial distance between the two scanning mirrors is no larger than is necessary to scan the wafer at the plurality of measuring points, and
   wherein a collision protection device is configured to limit angles of rotation of at least one scanning mirror of the two scanning mirrors to prevent the two scanning mirrors from colliding with one another.

2. The device of claim 1, wherein the optical coherence tomograph comprises:
   a light source;
   a beam splitter configured to split light generated by the light source into the measuring light beam and a reference light beam;
   a reference arm for guiding the reference light beam;
   an object arm utilizing the optical system and the scanning device for guiding the measuring light beam; and
   a detector configured to generate the interference signals from a superposition of the reference light beam guided in the reference arm) with a portion of the measuring light beam reflected at the wafer.

3. The device of claim 2, further comprising a switchable dimming device arranged in the reference arm and configured to prevent the propagation of the reference light beam in the reference arm when thickness measurements are made.

4. The device of claim 1, wherein the optical system has a field into which the measuring light beams are focused, and wherein the evaluation unit is configured to correct the calculated distance values in order to compensate for a curvature of the field.

5. The device of claim 4, wherein the evaluation unit is configured to read out correction values from a correction table stored in the evaluation unit.

6. The device of claim 5, wherein correction values for different operating wavelengths ranges are listed in the correction table.

7. The device of claim 1, wherein the collision protection device comprises at least one mechanical stop.

8. The device of claim 1, wherein the collision protection device comprises an electronic limiting device configured to electronically prevent a supply of control signals to the at least one scanning mirror which would lead to a predetermined angle of rotation range being exceeded.

9. The device of claim 1, wherein the optical system comprises at least one anamorphic optical element configured to correct a field curvature.

10. A method for measuring wafers, the method comprising the following steps:
   a) generating a measuring light beam with an optical coherence tomograph;
   b) directing the measuring light beam at a wafer with an optical system;
   c) deflecting the measuring light beam in two spatial directions with a scanning device, which is controlled in such a way that the measuring beam scans the surface of the wafer successively at a plurality of measuring points; and
   d) calculating distance values and/or thickness values based on interference signals provided by the optical coherence tomograph,
   e) providing the scanning device with exactly two scanning mirrors, which are each mounted rotatably about exactly one axis, and which are disposed relative to one another at a spatial distance no larger than is required to scan the wafer at the plurality of measuring points, and
   f) operating the scanning device such that a collision protection device limits angles of rotation of at least one scanning mirror of the two scanning mirrors to prevent the two scanning mirrors from colliding with one another.

11. The method of claim 10, wherein, in the optical coherence tomograph:
a light source generates light;
a beam splitter splits the light generated by the light source into the measuring light beam and a reference light beam;
the reference light beam is guided in a reference arm;
the measuring light beam is guided in an object arm; and
a detector generates the interference signals from a superposition of the reference light beam guided in the reference arm with a portion of the measurement light beam which is reflected by the wafer.

12. A device for measuring wafers, the device comprising:
an optical coherence tomograph configured to generate a measuring light beam and to direct the measuring light beam onto a wafer via an optical system;
a scanning device configured to deflect the measuring light beam in two spatial directions, the scanning device having exactly two scanning mirrors, which are each mounted rotatably about exactly one axis;
a control unit configured to control the scanning device in such a way that the measuring light beam scans the surface of the wafer successively at a plurality of measuring points;
an evaluation unit configured to calculate, from interference signals provided by the optical coherence tomograph,
distance values if the device is in a distance measuring mode, and
thickness values if the device is in a thickness measuring mode;
a switchable dimming device arranged in the reference arm, the switchable dimming device configured to prevent the propagation of the reference light beam in the reference arm if the device is in the thickness measurements mode and configured to pass the reference light beam in the reference arm if the device is in the distance measuring mode; and
a collision protection device,
wherein the two scanning mirrors are each capable of a predetermined angle of rotation and are separated by a spatial distance that would result in the two scanning mirrors colliding if fully rotated through the predetermined angle of rotation,
wherein the rotation angle of one or both of the two scanning mirrors necessary to scan the plurality of measuring points is less than the predetermined angle of rotation, and
wherein the collision protection device is configured to limit rotation of at least one scanning mirror of the two scanning mirrors to less than the predetermined angle of rotation to prevent the two scanning mirrors from colliding with one another.

13. The device of claim 12, wherein the switchable dimming device comprises a central shutter or a focal plane shutter.

14. The device of claim 12, wherein two measuring points of the plurality of measuring points have a distance $d_{max}$ with 140 mm $\leq d_{max} \leq$ 600 mm.

* * * * *